(12) United States Patent
Wang et al.

(10) Patent No.: US 12,712,507 B2
(45) Date of Patent: Aug. 18, 2026

(54) STACKED COAXIAL CAVITY COMBINER FOR COMBINING A PLURALITY OF AMPLIFIERS, THE COMBINER HAVING AN OUTER CONDUCTOR WALL AND PLURAL INNER CONDUCTOR BLOCKS

(71) Applicant: KOREA INSTITUTE OF FUSION ENERGY, Daejeon (KR)

(72) Inventors: Son Jong Wang, Daejeon (KR); Hyun Ho Wi, Daejeon (KR)

(73) Assignee: Korea Institute of Fusion Energy, Daejeon (KR)

(*) Notice: Subject to any disclaimer, the term of this patent is extended or adjusted under 35 U.S.C. 154(b) by 489 days.

(21) Appl. No.: 18/305,273

(22) Filed: Apr. 21, 2023

(65) Prior Publication Data

US 2024/0047845 A1 Feb. 8, 2024

(30) Foreign Application Priority Data

Aug. 2, 2022 (KR) ........................ 10-2022-0096365

(51) Int. Cl.

*H03F 3/60* (2006.01)
*H01P 5/12* (2006.01)
*H01P 5/18* (2006.01)

(52) U.S. Cl.

CPC ............... *H03F 3/602* (2013.01); *H01P 5/12* (2013.01); *H01P 5/183* (2013.01); *H03F 2200/451* (2013.01)

(58) Field of Classification Search

CPC .................................. H03F 3/602; H01P 5/12

(Continued)

(56) References Cited

U.S. PATENT DOCUMENTS 4,175,257 A * 11/1979 Smith et al. ............ H03F 3/602 330/61 A
4,656,438 A * 4/1987 Levinson ................ H03F 3/602 330/56

(Continued)

FOREIGN PATENT DOCUMENTS

WO WO 2014/120047 A1 8/2014

OTHER PUBLICATIONS

De La Morena et al., "Single-step port-reconfigurable cavity combiner with high efficiency", Nuclear Inst. and Methods in Physics Research Section A: Accelerators, Spectrometers, Detectors and Associated Equipment, vol. 972, Aug. 2020, 164108, https://doi.org/10.1016/j.nima.2020.164108.

*Primary Examiner* — Benny T Lee
(74) *Attorney, Agent, or Firm* — Knobbe, Martens, Olson & Bear, LLP

(57) ABSTRACT

A stacked coaxial cavity radio frequency power combiner is disclosed that includes: an outer conductor in which a cavity is formed in an axial direction; a plurality of amplifier modules, including an input coupler that surrounds the device main body, each amplifier module is spaced apart from each other on the outer wall of the device main body, stacked, and disposed radially and orthogonally to the central axis of the cavity; an inner conductor configured to stack and spaced apart by a predetermined inner gap in the central axial direction in the cavity of the device main body and include a plurality of inner conductor blocks disposed corresponding to each layer of the amplifier module; at least one inner insulating support located between the plurality of inner conductor blocks; and an output coupler provided at one side of the device main body and extended outside of the device main body.

16 Claims, 4 Drawing Sheets

(58) Field of Classification Search
USPC .......................................................... 333/125
See application file for complete search history.

(56) References Cited

U.S. PATENT DOCUMENTS

| | | | |
|---|---|---|---|
| 6,806,791 | B1 | 10/2004 | Wang et al. |
| 9,509,034 | B2 | 11/2016 | Xue et al. |

* cited by examiner

STACKED COAXIAL CAVITY COMBINER FOR COMBINING A PLURALITY OF AMPLIFIERS, THE COMBINER HAVING AN OUTER CONDUCTOR WALL AND PLURAL INNER CONDUCTOR BLOCKS

CROSS REFERENCE TO RELATED APPLICATION

The present application claims priority to Korean Patent Application No. 10-2022-0096365, filed Aug. 2, 2022, the entire content of which is incorporated herein for all purposes by this reference.

BACKGROUND

Field

The disclosed technology relates to a stacked coaxial cavity radio frequency power combiner and, more particularly, to a stacked coaxial cavity radio frequency power combiner that outputs the radio frequency combining a plurality of amplifier modules.

Description of the Related Art

In nuclear fusion research, accelerator, and the military defense field, the high-power radio frequency of 10 KW to 2 MW for energy transfer through the acceleration of charged particles in a plasma state is necessary.

In such fields, an electron tube has been mainly used, which easily oscillates or amplifies with high power and efficiency. However, due to the durability problem of the electron tube, the use of semiconductor amplifiers has recently increased as the efficiency of semiconductor amplifiers has increased.

Despite having several advantages, such as a long lifespan, and no need for high-voltage devices, semiconductor amplifiers have a limitation in power per unit module. Accordingly, although there has been an effort to continuously develop and acquire high power by combining a plurality of combiners such as the Wilkinson combiner, Gysel combiner, and waveguide combiner, which outputs low power, the conventional combiners have problems in that the number of combinable input ports is limited and have a high loss.

In other words, when the combiners are combined in a multi-stage to overcome the limitation of the number of combinable input ports, the conventional combiners for the semiconductor amplifiers have a problem in that the final combining loss rapidly increases if the loss coefficient, which generates at each individual combining stage, is applied.

For example, a waveguide cavity combiner, such as the cavity combiner disclosed in "*C. de la Morena*, 'Single-step port reconfigurable cavity combiner with high efficiency,' *Nucl. Instrum. Methods Phys. Res. A* (August 2020)," that can significantly increase the number of input ports in the high frequency more than 100 MHz has been developed and commercialized in the combiner capable of outputting several 100 KW with high efficiency.

Since the size of the waveguide cavity increases in the low frequency of less than 100 MHZ (e.g., the size of the cavity is 1.5 m, which is a half-wavelength in size, at 100 MHz and 3 m at 50 MHz), regardless of combined output, and the lower the frequency, such waveguide cavity combiner requires a larger cavity, there has been a problem in that the size of fabrication has become significantly large compared to the number of arrangement of the semiconductor amplifier.

SUMMARY

To address at least a portion of the above-described deficiencies, one or more aspects of the disclosed technology correspond to a stacked coaxial cavity radio frequency power combiner that can be used at a low frequency and can be miniaturized by providing a high-power output and high efficiency without limiting the number of input ports.

The technical aspects of the disclosed technology are not limited to the above-described technical aspects, and other technical aspects which are not described herein will become apparent to those skilled in the art from the following description.

One or more aspects of the disclosed technology provide a stacked coaxial cavity radio frequency power combiner including: a device main body, including an outer conductor, in which a cavity is formed in an axial direction; a plurality of amplifier modules, each amplifier module including an input coupler that surrounds the device main body, wherein the amplifier modules are spaced apart from each other on an outer wall of the device main body, stacked, and disposed radially and orthogonally to a central axis of the cavity; an inner conductor, including a plurality of inner conductor blocks, wherein the inner conductor blocks are stacked and spaced apart from each other by a predetermined inner gap in the central axial direction in the cavity of the device main body, and wherein the inner conductor blocks are disposed corresponding to each layer of the amplifier module; at least one inner insulating support located between the plurality of inner conductor blocks; and an output coupler provided at one side of the device main body and extending to the exterior of the device main body, wherein both ends of the plurality of inner conductors include a side gap to provide a capacitance, and electromagnetic waves of the input coupler of the plurality of amplifier modules are input to the output coupler through the plurality of inner conductor blocks.

In some embodiments of the disclosed technology, the device main body is provided such that a plurality of placement slots, into which each of the plurality of amplifiers is inserted and combined, are spaced apart from each other by a plurality of layers.

In some embodiments of the disclosed technology, the device main body has a cylindrical or polyhedral shape.

In some embodiments of the disclosed technology, a support placement groove in which the inner insulating support is accommodated and provided at both sides of the inner conductor block.

In some embodiments of the disclosed technology, the inner gap is larger than the side gap.

In some embodiments of the disclosed technology, the inner gap is at least twice as large as the side gap.

In some embodiments of the disclosed technology, the inner gap is smaller than the side gap.

In some embodiments of the disclosed technology, the inner gap is provided as half of the side gap.

In some embodiments of the disclosed technology, the inner conductor block has a cylindrical shape in which the support placement groove is disposed in a central region of an upper surface and a lower surface.

In some embodiments of the disclosed technology, the inner conductor may further include a side short disposed on a uppermost part and a lowermost part of the device main body and forming the side gap with respect to the inner conductor block.

In some embodiments of the disclosed technology, the output coupler may include an outer coupler configured to protrude to the outside of the device main body; and an inner coupler configured to connect to the outer coupler and dispose of inside the device main body.

In some embodiments of the disclosed technology, the inner coupler is electrically connected to a central region of one surface of an outermost inner conductor block among the plurality of inner conductor blocks in any one of the uppermost and lowermost parts of the device main body.

In some embodiments of the disclosed technology, the inner conductor may further include an outermost inner conductor block spaced apart from the inner conductor block by the inner gap at any one of the uppermost and lowermost parts of the device main body and spaced apart from the side short by the side gap, wherein the inner coupler extends from one outer end of the device main body to the cavity, and is provided as an inductive coupler to an outer surface of the outermost inner conductor block.

In some embodiments of the disclosed technology, the inner coupler may be provided as a "U" shape.

In some embodiments of the disclosed technology, an output port surrounding the output coupler at one end of the device main body may be provided.

In some embodiments of the disclosed technology, the uppermost and lowermost parts of the device main body may be provided with a conductive side short.

DETAILED DESCRIPTION

Figure 1:
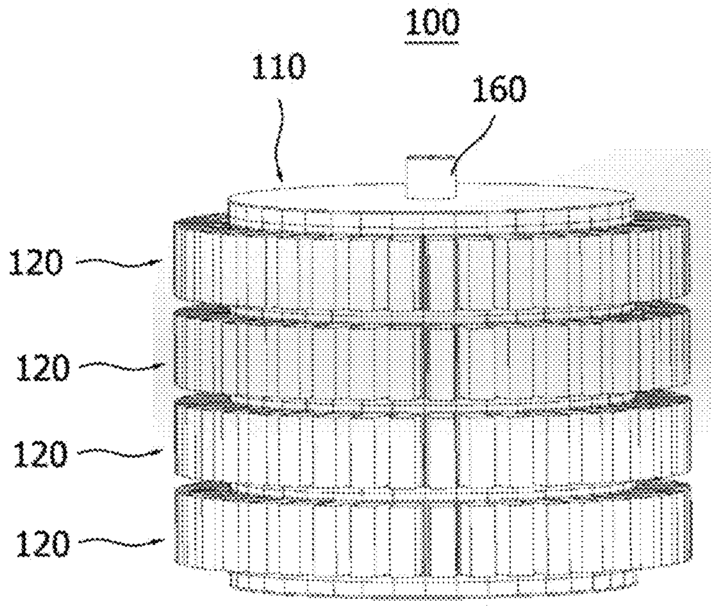
FIG. 1 illustrates a three-dimensional conceptual diagram of a stacked coaxial cavity radio frequency power combiner according to an embodiment of the disclosed technology.

The disclosed technology will be described hereinafter with reference to the accompanying drawings. However, the disclosed technology may be modified in various different ways, and the disclosed technology is not limited to the described exemplary embodiments. Moreover, the part not related to the description will be omitted in order to clearly describe the disclosed technology. Like reference numerals designate like elements throughout the description of the drawings.

In the description, when a part is connected (accessed, contacted, or coupled) with other parts, it includes "direct connection" as well as "indirect connection" in which the other member(s) is/are positioned between the parts. In addition, unless explicitly described to the contrary, the word "comprise," such as "comprises" or "comprising" will be understood to imply the inclusion of stated elements but not the exclusion of any other elements.

The terms used in this specification are merely used to describe particular embodiments and are not intended to limit the disclosed technology. Expression in the singular number include a plural form unless the context clearly indicates otherwise. In this specification, the term "comprise" or "have" is intended to designate characteristics, numbers, steps, operations, elements, components, or combinations thereof, but it is not intended to preclude the presence or addition of one or more other features, numbers, steps, operations, elements, components, or combinations.

Hereinafter, exemplary embodiments of the disclosed technology will be described in detail with reference to the accompanying drawings.

Figure 2:
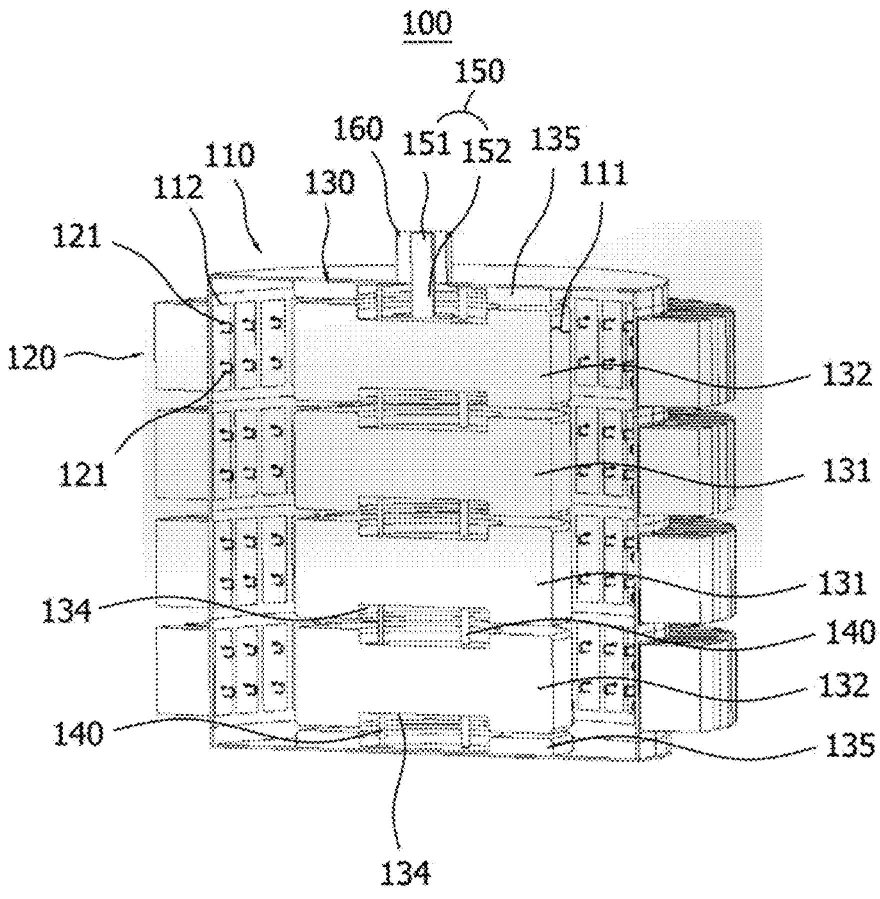
FIG. 2 illustrates a three-dimensional front cross-sectional perspective view taken along the central axis of FIG. 1.
Figure 3:
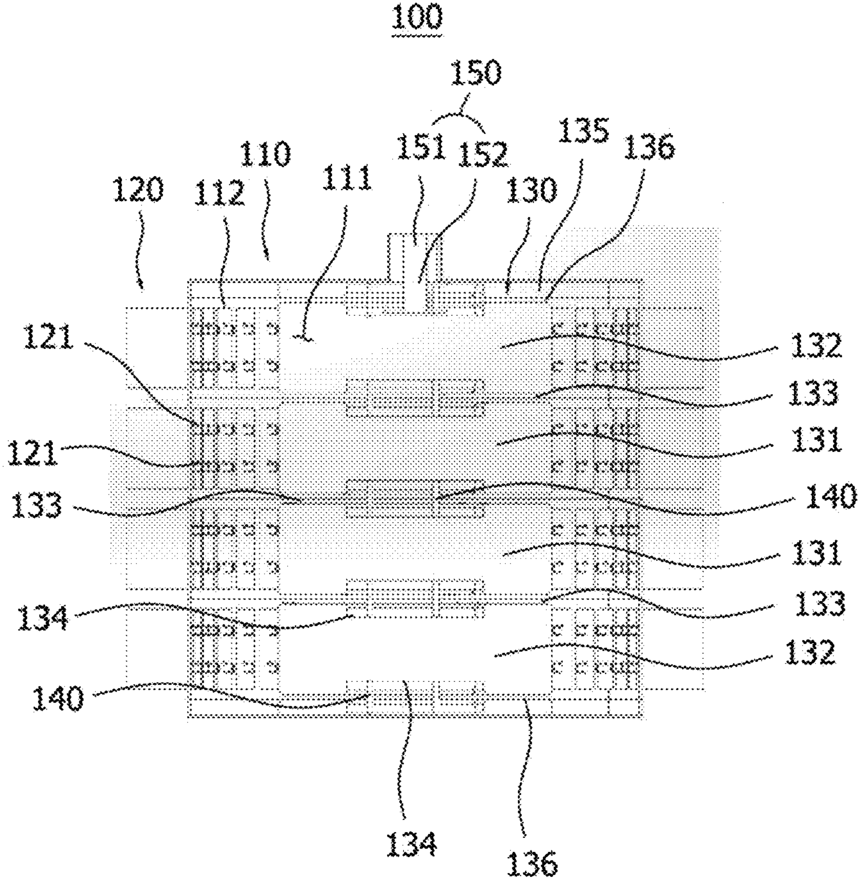
FIG. 3 illustrates a two-dimensional front cross-sectional view taken along the central axis of FIG. 1.

FIG. 1 illustrates a three-dimensional conceptual diagram of a stacked coaxial cavity radio frequency power combiner according to an embodiment of the disclosed technology, FIG. 2 illustrates a three-dimensional front cross-sectional view taken along the central axis of FIG. 1, and FIG. 3 illustrate a front view of FIG. 2.

Referring to FIGS. 1 to 3, a stacked coaxial cavity radio frequency power combiner 100 according to one or more embodiments of the disclosed technology can mainly include a device main body 110, a plurality of amplifier modules 120 installed in the device main body 110, an inner conductor 130 (FIGS. 2 and 3) corresponding to the plurality of amplifier modules 120, an inner insulating support 140 (FIGS. 2 and 3) forming gaps in the inner conductor 130 (FIGS. 2 and 3), and an output coupler 150 (FIGS. 2 and 3) configured to output electromagnetic waves of the plurality of amplifier modules 120 input to the inner conductor 130 (FIGS. 2 and 3).

As shown in FIGS. 2 and 3, the device main body 110 can include an outer conductor in which a cavity 111 can be configured in an axial direction, and a plurality of placement slots 112 can be provided and spaced apart in a plurality of layers into which each of the plurality of amplifier modules 120 are inserted and installed.

In the device main body 110, an outer conductor may be provided separately on the inner wall of the device main body 110, or provided as an inner wall itself of the device main body 110. Here, the outer conductor may allow the electromagnetic waves of the plurality of amplifier modules 120 can be transferred smoothly to the inner conductor 130 in the cavity 111 of the device main body 110.

The device main body 110 may be provided in a polyhedral shape (not shown that may be arranged in a cylinder or a polyhedron in which the plurality of amplifier modules 120 may be disposed in a circumferential direction.

In some embodiments, in the device main body 110, the inner wall, where the placement slot 112 is formed, may be formed in a polyhedral shape that corresponds to the number of the plurality amplifier modules 120, and may include an inner circumferential surface corresponding to the cylindrical shape.

The placement slot 112 can be provided in the height direction of the device main body 110 with the number of circumferential directions corresponding to the amplifier modules 120 and the number of stacked layers spaced apart from each other in the height direction.

The placement slot 112 can be provided in a cross-sectional shape into which the amplifier module 120 may be inserted. For example, corresponding to the illustrated cuboid rectangular shaped amplifier module 120, it may be formed in a rectangular shape elongated in the vertical height direction, but is not limited thereto. A peripheral part of the placement slot 112 may be formed as a flat plate on which an edge plate of the amplifier module 120 may be supported.

The plurality of amplifier modules 120 can surround the device main body 110, and can be stacked and spaced apart from the outer wall of the device main body, and can include an input coupler 121 arranged radially and orthogonally with respect to the central axis of the cavity 111.

The plurality of amplifier modules 120 can be disposed in the circumferential direction along the cylindrical or polyhedral shape of the device main body 110, and the input coupler 121 can be installed perpendicular to the inner conductor 130. Therefore, the electromagnetic waves emitted from the input coupler 121 can be transmitted perpendicularly to the outer circumferential surface of the inner conductor 130.

In addition, the plurality of amplifier modules 120 can be arranged to surround the entire outer wall of the device main body 110 by stacking and spacing the plurality of amplifier modules 120 apart from each other in the height direction of the device main body 110. The vertical height distance of the plurality of amplifier modules 120 can be determined to correspond to the outer circumferential surfaces of the inner conductor blocks 131 and 132 of each layer of the inner conductor 130, which is further described herein and elsewhere in the present disclosure.

The inner conductor 130 may include inner conductor blocks 131 and 132 stacked and spaced apart from each other by a predetermined inner gap 133 (FIG. 3) in the central axial direction in the cavity 111 of the device main body 110, and the inner conductor blocks 131 and 132 can be disposed corresponding to the plurality of amplifier modules 120 in each layer to receive electromagnetic waves emitted from the plurality of amplifier modules 120.

The inner conductor blocks 131 and 132 can be disposed radially so that the input coupler 121 of the plurality of amplifier modules 120 vertically corresponds to the outer circumferential surface thereof so that the efficiency of the electromagnetic waves emitted from the input coupler 121 can be sufficiently high.

The inner conductor blocks 131 and 132 may be provided in a cylindrical shape, in which a support placement groove 134 is disposed in the central region of an upper surface and a lower surface.

Both sides of the inner conductor blocks 131 and 132 may be provided with the support placement groove 134 disposed by accommodating the inner insulating support 140.

Meanwhile, the inner conductor 130 may further include a side short 135 disposed on the uppermost part and the lowermost part of the device main body and forming a side gap 136 with respect to the inner conductor block, and the plurality of inner conductor blocks 131 and 132 are spaced apart by an inner gap 133.

The short-circuited side 135 can be disposed at the uppermost and lowermost parts of the device main body 110 corresponding to the inner conductor block 132, and can be provided as a plate shape, which is significantly thinner than the inner conductor blocks 131 and 132.

The short-circuited side 135 can be disposed to be spaced apart from the outermost inner conductor block 132 disposed at the uppermost and lowermost parts of the device main body 110 by the side gap 136 (FIG. 3), thereby forming capacitance.

The inner gap 133 may be formed larger than the side gap 136, and may be provided as twice larger than that of the side gap 136. The relationship between the inner gap 133 and the side gap 136 is not limited thereto, and the inner gap 133 may be formed smaller than the side gap 136, and the inner gap 133 may be provided as half of the side gap 136. At this time, the side gap 136 may be used for forming the capacitance at both ends of the plurality of inner conductors 130.

The inner gap 133 of the plurality of inner conductor blocks 131 and 132 of the inner conductor 130, the outermost inner conductor 132, and the side gap 136 of the short-circuited side 135 may be maintained by the inner insulating support 140.

One or more inner insulating supports 140 can be disposed between the plurality of inner conductor blocks 131 and 132 to space the plurality of inner conductor blocks 131 and 132 apart and may be disposed at an interval of 120° about the central axis, for instance.

In addition, the inner insulating support 140 can be disposed between the outermost inner conductor block 132 and the short-circuited side 135 and spaced apart by the side gap 136.

In the plurality of amplifier modules 120, the electromagnetic waves concentrated in each layer of the inner conductor blocks 131 and 132 can pass through each layer of the inner conductor block 131 and 132, and output to the outside through the output coupler 150 disposed on the top of the device main body 110.

The output coupler 150 can be provided at one end of the device main body 110 and extends to the exterior of the device main body 110, and may include an outer coupler portion 151 disposed protruding outside of the device body 110, and an inner coupler portion 152 disposed inside of the device main body 110 connected to the outer coupler portion 151.

The inner coupler portion 152 may be electrically connected to the central region of one surface of the outermost inner conductor blocks 131 and 132 among the plurality of inner conductor blocks 131 and 132 at any one of the uppermost and lowermost parts of the device main body 110.

Substantially, the inner coupler portion 152 may be capacitively connected to the outermost inner conductor block 132 on the top side of the device main body 110 by being finely spaced apart. Although not illustrated, contrary to mentioned above, the output coupler 150 may be disposed in a reverse phase on the device main body 110.

In some embodiments, electromagnetic waves of the input coupler 121 of the plurality of amplifier modules 120 can be input to the output coupler 150 through the plurality of inner conductor blocks 131 and 132, and output to the outside through the output coupler 150. At this time, the output coupler 150 may be electrically connected to a place where concentrated electromagnetic waves are used to provide radio frequency energy.

On the other hand, as shown in FIGS. 1 and 2, an output port 160 that surrounds the output coupler 150 may be provided at one end of the device main body 110. Such output port 160 can protect the output coupler 150.

Hereinafter, a stacked coaxial cavity radio frequency power combiner, according to alternative embodiments of the disclosed technology, will be explained.

Figure 4:
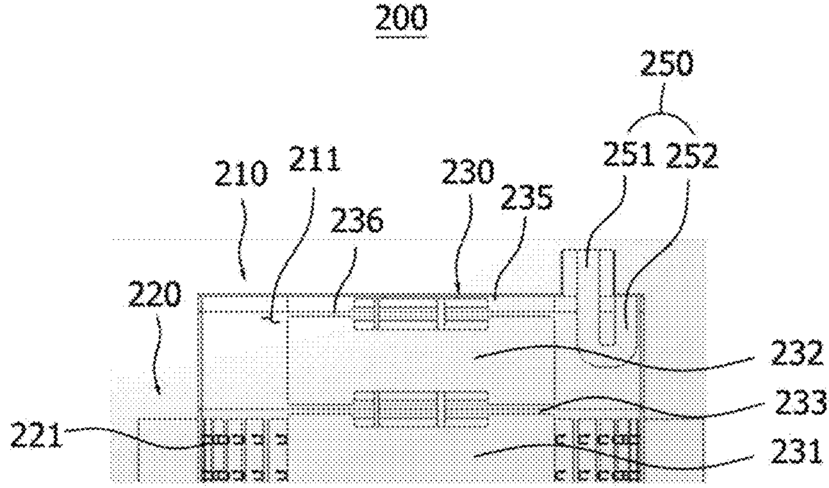
FIG. 4 illustrates an upper front cross-sectional view along the central axis of a stacked coaxial cavity radio frequency power combiner according to another embodiment of the disclosed technology.

FIG. 4 illustrates an upper front cross-sectional view along the central axis of a stacked coaxial cavity radio frequency power combiner according to another embodiment of the disclosed technology.

Referring to FIG. 4, the stacked coaxial cavity radio frequency power combiner 200, according to another embodiment, is almost similar to, or partially the same or the same as, the aforementioned embodiment, and includes a device main body 210, a plurality of amplifier modules 220 including an input coupler 221, an inner conductor 230, an inner insulating support, and an output coupler 250, and thus, redundant descriptions of the same structure will be omitted, and differences between structures and arrangements will be mainly described.

In other embodiments, the inner conductor 230 can be spaced apart from the inner conductor block 231 at the uppermost of the device main body 210 by the inner gap 233, and the short-circuited side 235 further can include an outermost inner conductor block 232 spaced apart by the side gap 236.

Since the arrangement of the plurality of amplifier modules 220 corresponding to the outermost inner conductor block 232 may be omitted in the device main body 210, the structure of the placement slot 212 may not be formed at the uppermost part. That is, the amplifier module 220 on the outer wall of the device main body 210, in which the inner coupler portion 252 (FIG. 4) can correspond to the outermost inner conductor block 232, can be omitted.

In addition, the output coupler 250 may include the inner coupler portion 252 extending from one outer end of the device main body 210 to a cavity 211, and an inductive coupler may be provided for the outer surface of the outermost inner conductor block 232. The inner coupler portion 252 may be provided as a "U" shape.

In other words, electromagnetic waves emitted from the plurality of amplifier modules 220 can be transmitted to the inner conductor blocks 231 and 232 of each layer and pass through the inner gap 233 and the side gap 236 of the side short 235 to the outermost inner conductor block 232, and output through the outer coupler 251 extending outside through the inner coupler portion 252 disposed in a "U" shape in one end of the cavity 211 of the outer conductor block 232.

Meanwhile, according to one or more embodiments described above with respect to FIGS. 1-3 and FIG. 4, respectively, the stacked coaxial cavity radio frequency power combiners 100 and 200 may increase the number of placements of the plurality of amplifier modules 120 and 220 by elongating the radius and length of the device main body 110 and 210, and in response, by providing the inner conductors 130 and 230, concentrated high-power electromagnetic waves of the amplifier modules 120 and 220 disposed in the device main bodies 110 and 210 may be provided through the output couplers 150 and 250.

The above-described description of the disclosed technology is for illustrative purposes. It would be apparent to one skilled in the art may understand that it is possible to easily modified in other specific forms without departing from the technical spirit and essential features of the disclosed technology. Thus, above-described embodiments should be understood that they have been presented by way of example, and not limitation. For example, each component described as one-piece embodiment may be distributed. The component described as the degree of dispersion may be carried out in a combined form.

The scope of the disclosed technology is represented by the following claims, and it should be construed that all changes or variations derived from the meaning and scope of the claims and the equivalent concept thereof are included within the scope of the disclosed technology.

The effects of the disclosed technology, according to the configuration above-mentioned, may provide a stacked coaxial cavity radio frequency power combiner that can be used at low frequencies and is capable of miniaturized, high-efficiency high output combining without limiting the number of input ports.

Furthermore, the use of the coaxial cavity in the disclosed technology may provide an advantage of preventing the size from increasing even at a lower frequency than the conventional invention.

The effect of the disclosed technology is not limited to the above-mentioned effects, and it should be understood to include all possible effects deduced from the configuration of the invention described in the detailed description or the claims of the disclosed technology.

What is claimed is:

1. A stacked coaxial cavity radio frequency power combiner comprising:

- a device main body comprising an outer wall, the outer wall comprising an outer conductor and defining an inner cavity extending along a central axial direction of the device main body;
- a plurality of amplifier modules arranged in a plurality of amplifier layers stacked in the central axial direction while being spaced apart from each other, wherein each of the amplifier layers circumferentially surrounds the device main body, and
- wherein each amplifier module comprises:
  - an external portion formed outside of the outer wall and protruding outward in a radial direction orthogonal to the central axial direction, and
  - an internal portion exposed to the inner cavity and having formed thereon an input coupler protruding inward in the radial direction;
- an inner conductor, including a plurality of inner conductor blocks, wherein the inner conductor blocks are stacked and spaced apart from each other by a respective predetermined inner gap in the central axial direction in the inner cavity of the device main body, and wherein each of the inner conductor blocks is positioned to overlap a respective one of the amplifier layers;
- at least one inner insulating support located between the plurality of inner conductor blocks; and
- an output coupler provided at one side of the device main body and extending to an exterior of the device main body,
- wherein both ends of the inner conductor include a respective side gap to provide a capacitance, and electromagnetic waves of the input coupler of each of the plurality of amplifier modules are input to the output coupler through the plurality of inner conductor blocks.

2. The stacked coaxial cavity radio frequency power combiner of claim 1, wherein the device main body is provided such that a plurality of placement slots, into which each of the plurality of amplifier modules is inserted and installed, are stacked and spaced apart from each other into the plurality of amplifier layers.

3. The stacked coaxial cavity radio frequency power combiner of claim 1, wherein the device main body has a cylindrical or polyhedral shape.

4. The stacked coaxial cavity radio frequency power combiner of claim 1, wherein an uppermost part and a lowermost part of the device main body are provided with a conductive short-circuited side.

5. The stacked coaxial cavity radio frequency power combiner of claim 1, wherein each of the respective predetermined inner gaps is larger than either of the side gaps.

6. The stacked coaxial cavity radio frequency power combiner of claim 5, wherein each of the respective predetermined inner gaps is at least twice as large as either of the side gaps.

7. The stacked coaxial cavity radio frequency power combiner of claim 1, wherein each of the respective predetermined inner gaps is smaller than either of the side gaps.

8. The stacked coaxial cavity radio frequency power combiner of claim 7, wherein each of the respective predetermined inner gaps is provided as half of either of the side gaps.

9. The stacked coaxial cavity radio frequency power combiner of claim 1, further comprising:

a short-circuited side disposed on an uppermost part and a lowermost part of the device main body and forming the respective side gap with respect to a respective outermost inner conductor block of the inner conductor.

10. The stacked coaxial cavity radio frequency power combiner of claim 9, wherein the output coupler comprises:

an outer coupler portion configured to protrude to the exterior of the device main body; and an inner coupler portion configured to connect to the outer coupler portion and disposed inside the device main body.

11. The stacked coaxial cavity radio frequency power combiner of claim 10, wherein an output port surrounding the output coupler at one end of the device main body is provided.

12. The stacked coaxial cavity radio frequency power combiner of claim 10, wherein the inner coupler portion is electrically connected to a central region of one surface of the respective outermost inner conductor block among the plurality of inner conductor blocks in either of the uppermost part or the lowermost part of the device main body.

13. The stacked coaxial cavity radio frequency power combiner of claim 10, wherein the respective outermost inner conductor block is spaced apart from the plurality of inner conductor blocks by the respective predetermined inner gap at corresponding one of the uppermost and lowermost parts of the device main body and is spaced apart from the short-circuited side by the respective side gap, wherein the inner coupler portion extends from one outer end of the device main body to the inner cavity, and is provided as an inductive coupler to an outer surface of the respective outermost inner conductor block.

14. The stacked coaxial cavity radio frequency power combiner of claim 13, wherein the inner coupler portion is provided as a "U" shape.

15. The stacked coaxial cavity radio frequency power combiner of claim 1, further comprising a support placement groove in which the at least one inner insulating support is accommodated and provided at both sides of the corresponding inner conductor block.

16. The stacked coaxial cavity radio frequency power combiner of claim 15, wherein the corresponding inner conductor block has a cylindrical shape in which the support placement groove is disposed in a central region of an upper surface of the corresponding inner conductor block and a lower surface of the corresponding inner conductor block.

* * * * *